(12) United States Patent
Avestruz et al.

(10) Patent No.: US 11,949,410 B2
(45) Date of Patent: Apr. 2, 2024

(54) CONTROL CONDITIONING

(71) Applicant: The Regents of the University of Michigan, Ann Arbor, MI (US)

(72) Inventors: Al-Thaddeus Avestruz, Ann Arbor, MI (US); Xiaofan Cui, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 17/972,218

(22) Filed: Oct. 24, 2022

(65) Prior Publication Data
US 2023/0131880 A1 Apr. 27, 2023

Related U.S. Application Data

(60) Provisional application No. 63/270,911, filed on Oct. 22, 2021.

(51) Int. Cl.
*H03K 17/56* (2006.01)
*H03K 5/22* (2006.01)

(52) U.S. Cl.
CPC ............ *H03K 17/56* (2013.01); *H03K 5/22* (2013.01)

(58) Field of Classification Search
CPC . H03K 17/56; H03K 5/22; H03K 7/08; H03F 1/52; H03F 3/24; H03F 1/30; H03F 1/34; H03F 3/72; H02M 3/158; H02M 3/156; H02M 3/157; H02M 1/092; H02M 1/08; H02M 3/1582; H02M 7/797; H02M 7/793; H02M 7/81; H02M 7/79; H02M 3/33523; H02M 1/0845; H03M 1/12; G06F 30/30; G06F 1/28; G06F 30/33; G06F 2119/06; G06F 1/3206; H03G 3/3042
See application file for complete search history.

(56) References Cited

U.S. PATENT DOCUMENTS

| | | | | |
|---|---|---|---|---|
| 7,859,354 | B1 * | 12/2010 | Chen | .................... G06F 1/08 331/173 |
| 9,590,524 | B1 * | 3/2017 | Jacobson | ............... H02M 7/217 |
| 10,298,126 | B1 * | 5/2019 | Sharma | ................. H02M 3/157 |
| 2006/0227472 | A1 * | 10/2006 | Taylor | ..................... H02H 3/04 361/42 |

(Continued)

OTHER PUBLICATIONS

A. Simon-Muela, S. Petibon, C. Alonso, and J. L. Chaptal, Practical implementation of a high-frequency current-sense technique for VRM; IEEE Transactions on Industrial Electronics, vol. 55, No. 9, pp. 3221-3230, 2008.

(Continued)

*Primary Examiner* — Lincoln D Donovan
*Assistant Examiner* — Tyler J Pereny
(74) *Attorney, Agent, or Firm* — Lempia Summerfield Katz LLC

(57) ABSTRACT

A system includes control circuitry configured to control an output signal. The control circuitry and/or various other sources of undesirable signal components may corrupt the control signal used by the control circuitry to correct the output signal. Conditioning circuitry may effect current-domain repair on the control circuitry by providing feedback-based conditioning actuation, including comparator overdrive, to the control circuitry.

20 Claims, 6 Drawing Sheets

(56) References Cited

U.S. PATENT DOCUMENTS

| | | | | |
|---|---|---|---|---|
| 2007/0001892 A1* | 1/2007 | Kuttner | ............... | H03M 1/403 |
| | | | | 341/161 |
| 2020/0050226 A1* | 2/2020 | Miller | ................... | H03K 17/56 |

OTHER PUBLICATIONS

AD8469: Fast, Rail-to-Rail, Low Power, 2.5 V to 5.5 V, Single-Supply TTL/CMOS Comparator, Analog Devices, Inc.; 2012; 12 pp.

B. Karanayil, M. Ciobotaru, and V. G. Agelidis; Power flow management of isolated multiport converter for more electric aircraft, IEEE Transactions on Power Electronics, vol. 32, No. 7, pp. 5850-5861, 2017.

E. Jury and B. Lee, On the stability of a certain class of nonlinear sampled-data systems; IEEE Transactions on Automatic Control, vol. 9, No. 1, pp. 51-61, 1964.

F. Chang, X. Cui, M. Wang, W. Su, and A. Q. Huang, Large-Signal Stability Criteria in DC Power Grids with Distributed-Controlled Converters and Constant Power Loads; IEEE Transactions on Smart Grid, 2020, 16 pp.

G. Di Capua and N. Femia; A novel method to predict the real operation of ferrite inductors with moderate saturation in switching power supply applications; IEEE Transactions on Power Electronics, vol. 31, Mar. 2016; 9 pp.

G. Verghese, C. Bruzos, and K. Mahabir, Averaged and sampled-data models for current mode control: a re-examination; 20th Annual IEEE Power Electronics Specialists Conference, pp. 484-491, 1989.

H. Wang, M. Han, R. Han, J. M. Guerrero, and J. C. Vasquez, A decentralized current-sharing controller endows fast transient response to parallel DC-DC converters; IEEE Transactions on Power Electronics, vol. 33, No. 5, pp. 4362-4372, May 2018.

L. Ding, S.-C. Wong, and C. K. Tse, Bifurcation Analysis of a Current-Mode Controlled DC Cascaded System and Applications to Design; IEEE Journal of Emerging and Selected Topics in Power Electronics, 2020; 11pp.

LT1711/LT1712—Single/Dual 4.5ns, 3V/5V/±5V, Rail-to-Rail Comparators; Linear Technology Corporation, Tech. Rep., 2001; 12 pp.

M. R. Abedi and K. Y. Lee, Disturbance rejection of peak current-mode control for bidirectional battery charging; IEEE Power and Energy Society General Meeting, Nov. 2016; 5 pp.

N. Femia, K. Stoyka, and G. Di Capua; Impact of Inductors Saturation on Peak-Current Mode Control Operation; IEEE Transactions on Power Electronics, 2020; 12 pp.

N. McNeill, N. K. Gupta, and W. G. Armstrong, Active current transformer circuits for low distortion sensing in switched mode power converters; IEEE Transactions on Power Electronics, vol. 19, No. 4, pp. 908-917, 2004.

Q. Li, J. Zhang, and U. Epple, Design and EXIT chart analysis of a doubly iterative receiver for mitigating impulsive interference in OFDM systems; IEEE Transactions on Communications, vol. 64, No. 4, pp. 1726-1738, 2016.

R. Brockett, The status of stability theory for deterministic systems; IEEE Transactions on Automatic Control, vol. 11, No. 3, pp. 596-606, 1966.

R. P. Singh and A. M. Khambadkone, Giant magneto resistive (GMR) effect based current sensing technique for low voltage/high current voltage regulator modules; IEEE Transactions on Power Electronics, vol. 23, No. 2, pp. 915-925, 2008.

R. Redl and I. Novak; Instabilities in current-mode controlled switching voltage regulators, IEEE Power Electronics Specialists Conference, 1981, pp. 17-28.

R. Roy and S. Kapat, Discrete-Time Framework for Analysis and Design of Digitally Current Mode Controlled Intermediate Bus Architectures for Fast Transient and Stability; IEEE Journal of Emerging and Selected Topics in Power Electronics, 2020; 12 pp.

R. Y. Zhang, A.-T. Avestruz, J. K. White, and S. B. Leeb, Design of Resonance Damping via Control Synthesis; 2015 IEEE 16th Workshop on Control and Modeling for Power Electronics (COMPEL), 2015, pp. 1-9.

V. Svikovic, J. J. Cortes, P. Alou, J. A. Oliver, O. Garcia, and J. A. Cobos, Multiphase current-controlled buck converter with energy recycling Output Impedance Correction Circuit (OICC); IEEE Transactions on Power Electronics, vol. 30, No. 9, pp. 5207-5222, 2015.

X. Cui and A. Avestruz; A new framework for cycle-by-cycle digital control of megahertz-range variable frequency buck converters; IEEE 19th Workshop on Control and Modeling for Power Electronics (COMPEL), 2018, pp. 1-8.

X. Cui and A.-T. Avestruz, Switching-synchronized sampled-state space modeling and digital controller for a constant off-time,brcurrent-mode boost converter; 2019 American Control Conference (ACC), 2019, pp. 1-8.

X. Cui, C. Keller, and A.-T. Avestruz, Cycle-by-Cycle Digital Control of a Multi-Megahertz Variable-Frequency Boost Converter for Automatic Power Control of LiDAR, 2019 IEEE Energy Conversion Congress and Exposition (ECCE), 2019, pp. 702-711.

Y. Chen, F. Xie, B. Zhang, D. Qiu, and M. Xu, Analysis of Digital PCM-Controlled Boost Converter with Trailing-Edge Modulation based on z-domain and Describing-Function Model; IEEE Journal of Emerging and Selected Topics in Power Electronics, 2020; 10 pp.

Y. Chen, Y. R. Nan, Q. G. Kong, and S. H. Zhong, An input-adaptive self-oscillating boost converter for fault-tolerant LED driving with widerange ultralow voltage input; IEEE Transactions on Power Electronics, vol. 30, No. 5, pp. 2743-2752, 2015.

Y. Li, K. R. Vannorsdel, A. J. Zirger, M. Norris, and D. Maksimovic, Current mode control for boost converters with constant power loads; IEEE Transactions on Circuits and Systems I: Regular Papers, vol. 59, No. 1, pp. 198-206, 2012.

Y. Wang, X. Ruan, Q. Jin, H. Xi, X. Xiong, Y. Leng, and Y. Li, Elimination of the interaction of the converters in switch-linear hybrid envelope tracking power supplies, IEEE Transactions on Power Electronics, vol. 35, No. 2, pp. 2053-2066, Feb. 2020—Abstract Only.

* cited by examiner

CONTROL CONDITIONING

PRIORITY

This application claims priority to U.S. Provisional Patent Application No. 63/270,911, filed Oct. 22, 2021, and titled Control Conditioning, which is incorporated by reference herein in its entirety.

This invention was made with government support under DE-EE0007549 awarded by the U.S. Department of Energy. The government has certain rights in the invention.

BACKGROUND

Technical Field

The disclosure relates generally to control conditioning.

Brief Description of Related Technology

Increasingly complex electronics have given rise to need for power conversion and other signal processing in various context. For example, devices including power supply circuitry may power components at various power levels and/or other input constraints. Accordingly, there is increasing demand for systems that efficiently and accurately process signals in variety of power and frequency environments. Improvements to signal processing technologies will continue to drive industrial demand.

DETAILED DESCRIPTION

In various contexts, an electrical system may use in-device power scaling, radio frequency (RF) signal amplification, DC-to-DC (direct-current-to-direct-current) conversion, phase-locked-loops, AC (alternating current) signal control, high-frequency current modes or other electrical components. In various scenarios, corruption (e.g., undesirable deviations from an "ideal", desired output signal) may affect an output signal. In some cases, a conditioning response may be applied to control circuitry for the generation of the output signal without corruption (or with reduced corruption). Corruption may include signal interference, affects from imperfect circuit operation, or other undesired signal artifacts. In some cases, a conditioning response may be applied to a signal or to circuitry controlling generation/maintenance of the signal to have a restorative effect removing/reducing corruption.

In various implementations, a holistic approach may be taken to corruption mitigation. Although corruption may be viewed as a deviation from an ideal detected output signal, and mitigation may be applied as a correction to the non-ideal detection at the output (e.g., from a viewpoint similar to having a corrupted output feedback sensor as the source of the corruption), corruption may stem from virtually any component on the signal line, such as a feedback sensor, control plant, feedback comparator, control circuitry, and/or other parts or signal paths. Accordingly, the techniques and architectures discussed provide conditioning to repair corruption analyzed as stemming from the various sources. In various implementations, in lieu of or in addition to the direct application of a compensation signal to a feedback signal (or other signal) a conditioning response may be applied the circuitry (e.g., control circuitry, control plant circuitry, feedback path/sensor, and/or other circuitry).

Figure 1:
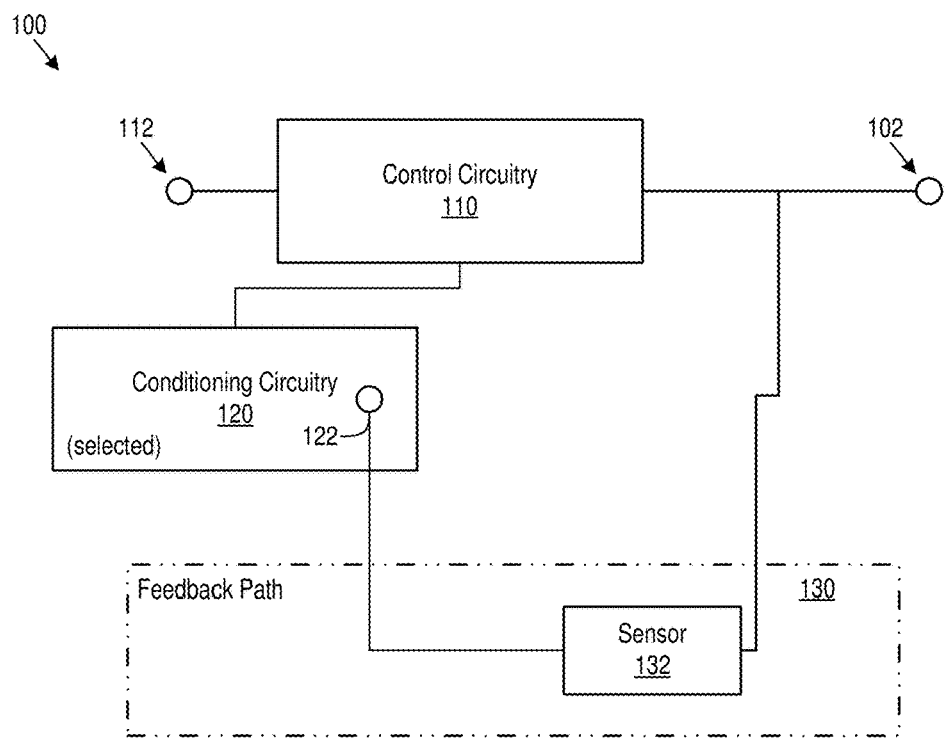
FIG. 1 shows an example control device.
Figure 1:
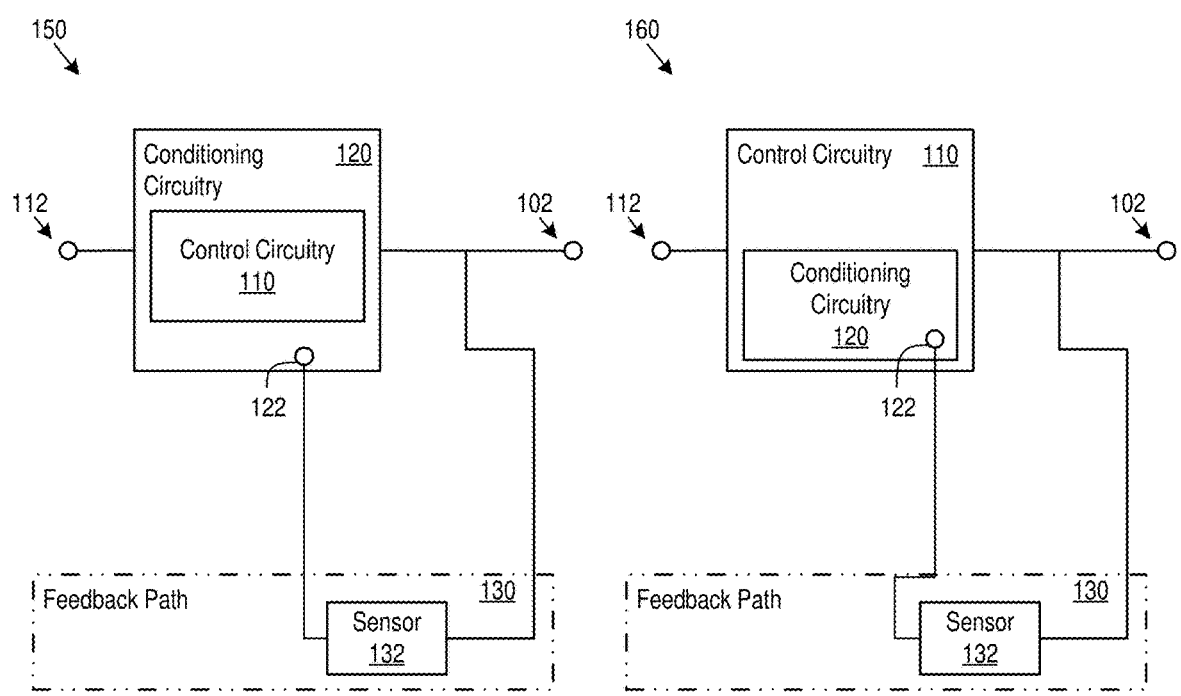

FIG. 1 shows an example control device 100. The example control device may include an output port (102) which may output an output signal. The output signal may deviate from an ideal—in other words, the output signal may include undesirable characteristics (e.g., from signal interference or other origins), which may be corruption. In some cases, corruption may be assumed due to a priori analysis of the device or a similar/equivalent device. Accordingly, corruption may include assumed corruption. Assumed corruption may be determined to be present without necessarily relying on direct characterization or confirmation of the presence of the assumed corruption. Further, assumed corruption may be assumed to be present without necessarily relying on an ideal reference for comparison. Nevertheless, in some systems assumed corruption may be characterized and/or confirmed through reference comparison.

The example control device 100 may include a control port 112 to receive a raw control signal which may be used to govern generation of the output signal. The raw control signal may include intrinsic corruption (e.g., from the system providing the raw control signal) and may be corrupted as a result of characteristics of the control device 100, such as input impedance, ringing, or other corruption sources.

The control port 112 may be coupled to control circuity 110, which may control the output signal using an actuation that is based on the raw control signal and the conditioning response which may be applied to the control circuitry (e.g., either directly and/or via other components of the example device). The control circuitry may include voltage controllers, non-linear controllers, control plants, or other control circuitry. Further, the control circuitry may include conditioning ports or other inputs to receive conditioning signals. Additionally or alternatively, the control circuitry may be merged with and/or subsumed 150 by conditioning circuitry, discussed below (or vice versa 160). The conditioning response may be used by the control signal to generate the conditioned control signal based on the raw control signal. The actuation may cause deviation from the output signal that would be prescribed by the raw control signal. In various implementations, this deviation may mitigate and/or remove assumed corruption in the output signal.

In various implementations, conditioning circuitry may be coupled to the control circuitry. The conditioning circuitry 120 may generate the conditioning inference that may be used to condition the control circuitry. The conditioning circuitry 120 may be selected based on one or more of the conditioning-type-specific models discussed below and/or include overdrive comparator circuitry, which may generate comparator-based overdrive conditioning response based on signal characteristics present in a feedback signal. The conditioning circuitry 120 may include a feedback port 122 on which the feedback signal is received.

The conditioning response may include various conditioning responses of various types. For example, the conditioning response may be generated via inclusion of a low-pass filter as the conditioning circuitry (or a portion thereof). In an example, the conditioning response may include adding a conditioning ramp, for example a compensation ramp or slope as discussed in the illustrative example implementations, or another conditioning ramp (which may include a nonlinear ramp). In an example, the conditioning response may include causing a trigger response to a first detected trigger event (e.g., as opposed to suppressing responses to detected trigger events). As discussed above, the trigger response may include overdrive response from a comparator with an extended overdrive response.

The example control device 100 may further include a feedback path 130 coupled to the feedback port of the conditioning circuitry. The feedback path may include a sensor 132 coupled to the output port 102. The sensor 132 may monitor the output signal. For example, the sensor 132 may sample the output signal (e.g., voltage sampling and/or other sampling). In some cases, the sensor may divert a portion of the signal from the output signal (e.g., for current sampling and/or other characterization). The sensor 132 (and, in some cases, other circuitry on the feedback path 130) may generate the feedback signal based on the monitoring of the output signal. The various compensation inference types may be selected using conditioning-type-specific models. The conditioning-type-specific models may include algorithmic selection for various model parameters, e.g., low-pass filter band/rejection ratio, compensation ramp slope, comparator parameters (e.g., positive interference for delay and/or negative interference for advancement), trigger event characteristics, and/or other parameters.

In an example, the conditioning circuitry 120 may include an overdrive comparator. the output of the comparator does not necessarily change instantaneously when the input difference crosses the voltage threshold, which may cause a delay. The input overdrive may be defined as this voltage difference after the threshold is crossed, but before the output changes state. The input overdrive can be positive or negative. The directionality of the overdrive may depend on whether the signal is positive-going or negative-going. For example, for peak current detection, input overdrive occurs when the current sensor voltage is above the voltage threshold set by the current command. Conversely, for valley current detection, overdrive occurs when the sensor voltage is below the voltage threshold set by the current command. The delay time depends on the input overdrive. Additionally or alternatively, because the directionality of the response is dependent whether the signal is positive-going or negative-going the overdrive interference may have opposite effects on signals tending to cause early trigger and those tending to cause late triggers. Therefore, the overdrive interference may be used to bound the trigger delay time for "worst case" scenarios. For trigger events, overdrive delay may be used to ensure that triggering is not advanced beyond an advance trigger bound nor delayed beyond a late trigger bound. This may improve stability.

Figure 2:
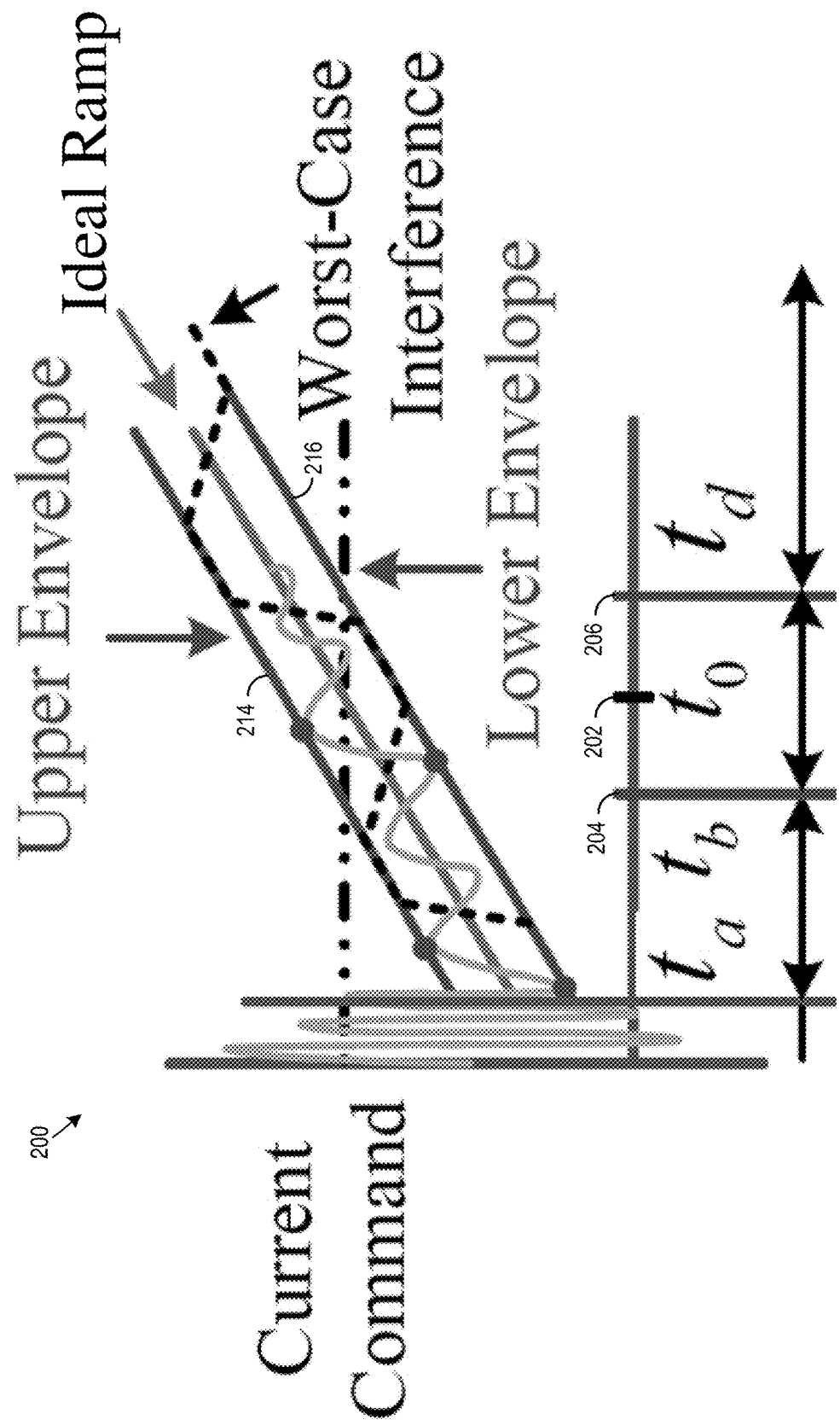
FIG. 2 shows an illustrative trigger detection plot for an example overdrive comparator compensation system.

FIG. 2 shows an illustrative trigger detection plot 200 for an example overdrive comparator compensation system. In the example plot, a signal trigger event 202 may have an idealized trigger time of $t_0$. The worst case bounds 214, 216 implemented by the overdrive comparator constrain the trigger to occur between a worst case advance 204 and a worst case delay 206. This may prevent system instability.

In some cases, the overdrive comparator may be selected such that the minimum on time for the comparator is minimized without destabilizing the system. In some cases, the minimum on time may be selected to equal the maximum allowed overdrive delay.

Virtually any comparator circuit may be used to provide overdrive interference. However, specific selections of minimum on time and/or comparator slew may be used to select specific worst case bounds. The specific worst case bounds may be selected based on system parameters.

Figure 3:
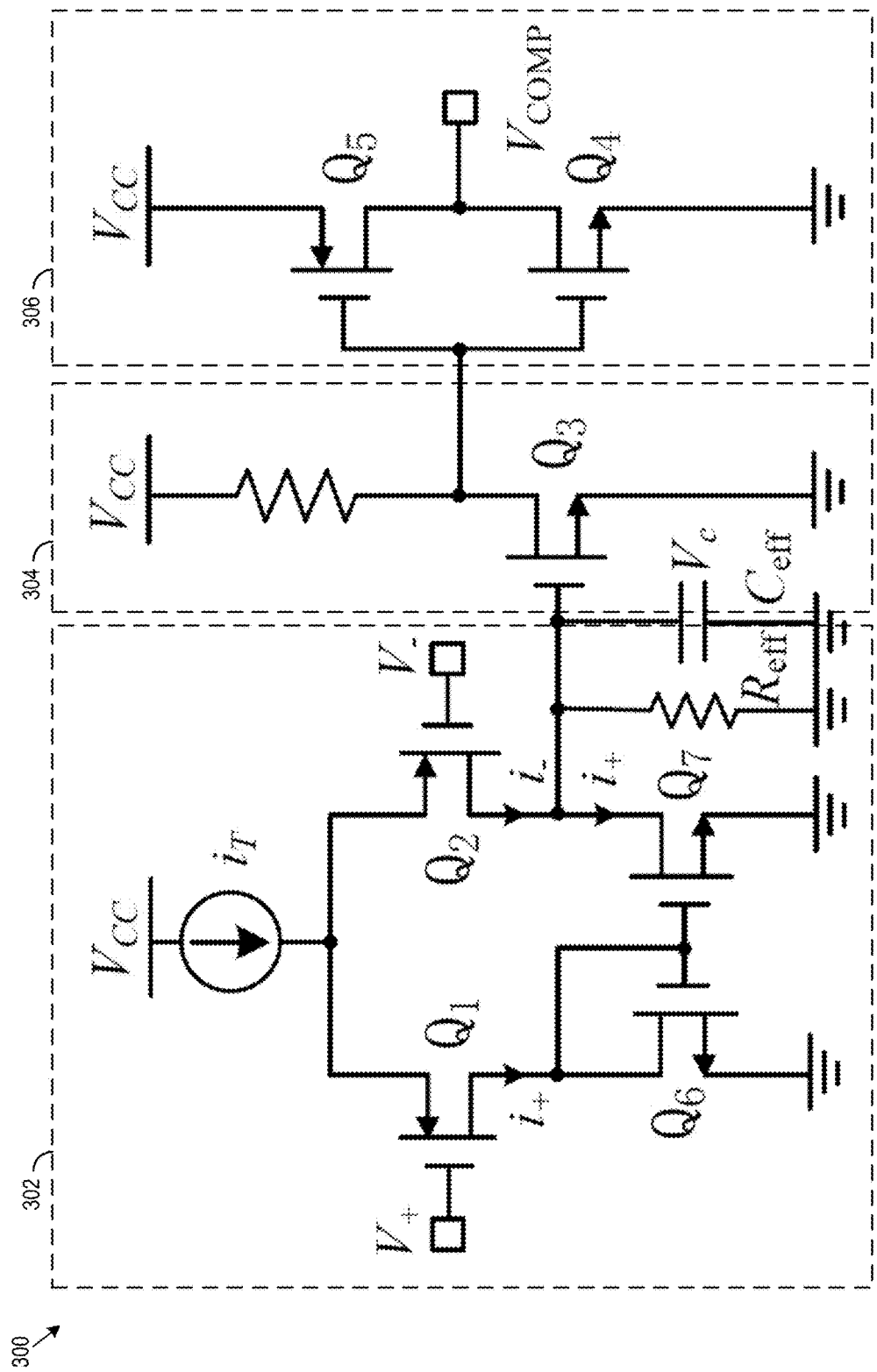
FIG. 3 shows an example multi-stage comparator.

In some implementations, a multi-stage comparator design may be used. FIG. 3 shows an example multi-stage comparator 300 which may be implemented to provide overdrive interference. The example multi-stage comparator includes a differential-pair front end 302 (Stage I), a common-source amplifier 304 (Stage II), and a logic inverter output 306 (Stage III). The equivalent capacitance at the output of Stage I is $C_{eff}$. The comparator output toggles if the voltage difference $V_+ - V_-$ lasts long enough so that $C_{eff}$ is charged or discharged to cross the voltage threshold of Stage II 304. The current at the output of Stage I is $i_- - i_+$, where g is a nonlinear transconductance. Because of $R_{eff}$, which is the effective resistance at the output of Stage I 302, the charging current for $C_{eff}$ may be kept smaller than $i_- - i_+$. In various implementations, $R_{eff}$ effectively decreases the transconductance. For the analysis, we choose a constant G, which is the largest small-signal transconductance in the range of g. Choosing the largest transconductance results in the lowest comparator overdrive delay and hence a conservative design for stability. Because g is determined by $i_T$, overdrive delay can be programmed by changing this tail current $i_T$, for example in an integrated circuit design. Although various comparator models may be implemented, the example multi-stage comparator 300 provides improved stability for a large class of circuits (including virtually any power converter) with arbitrary design parameters, e.g., considering circuit signal properties without placing constraints on hardware design.

For the various comparators, a comparator-specific model may be used for the selection of comparators parameters such as the minimum on time, the maximum allowed overdrive delay and/or other parameters. For example, for the example multi-stage comparator 300 the selection of the maximum allowed overdrive delay may be modeled as:

$$t_{od}^{max} = \frac{A_{ub}}{m_1} + \sqrt{\left(\frac{A_{ub}}{m_1}\right)^2 + \frac{2}{m_1}(V_{th}\tau + B)}, \quad \text{eq. 1}$$

where $$\tau = \frac{C_{eff}}{G}, B = \int_{-\infty}^{+\infty} \left|\frac{W(\omega)}{\omega}\right| d\omega. \quad \text{eq. 2}$$

where:

$$V_{trig}\tau \geq \frac{4A_{ub}^2}{m_1} + B, \quad \text{eq. 3}$$

Where $m_1$ includes a ramp slope, $t_{od}^{max}$ includes an overdrive delay, $\omega(t)$ includes an interference function, $C_{eff}$ includes a capacitance at the output, $\tau$ includes a design variable (e.g., an objective constraint), and $A_{ub}$ includes an upper bound of an undesirable signal component.

In an example, the conditioning circuitry may be configured to provide slope compensation. In some cases, providing a linear current ramp (which may include a repeating sawtooth or other repeating current profile) may reduce undesirable signal conditions. Slope compensation may be implemented independently and/or along with other compensation schemes such as comparator overdrive compensation and/or first-in-time triggering.

For slope compensation, the addition of a current ramp may lessen the effect of undesirable signal components, e.g., ringing, nonlinearity, multi-valued states, discontinuities, gain errors, offset errors, and/or other undesirable signal components. Applying slope compensation may correct for gain and offset errors due to their nature as linear errors in the signal. Additionally or alternatively, slope compensation may correct for other undesirable signal components by providing a slope for which the effect of the undesirable signal component is lessened, e.g., a signal slope at for which trigger events occur closer to the ideal time rather than being advanced or delayed by the undesirable signal components.

In some cases, the undesirable signal components may be characterized (e.g., for an effect "size") by a Lipschitz constant. The upper bound on the Lipschitz constant for the effect may be used to select the compensation slope to be used. Accordingly, selection of compensation slopes for systems characterized with a given upper bound to their corresponding Lipschitz constant may be modeled as:

$$\hat{m}_s^* = \sqrt{\frac{1}{4} + \hat{L}^2} - \frac{1}{2}. \quad \text{eq. 4}$$

where:

$$\hat{m}_s \triangleq \frac{m_s}{m_1}, \hat{L} \triangleq \frac{L_{ub}}{m_1}. \quad \text{eq. 5}$$

Where $m_1$ includes a ramp slope, $m_s$ includes a compensation ramp slope, and $L_{ub}$ includes an upper bound of the Lipschitz constant of the undesirable signal component;

In an example, the conditioning circuitry may be configured to provide first-in-time triggering. In some cases, the conditioning circuitry may use first event triggering to suppress and/or reduce the effect of undesirable signal components. For example, first-in-time triggering may be used to trigger compensation that may repair portions of the signal the may be multi-valued or otherwise quickly diverging from the triggering value.

In some implementations, the first-in-time triggering may be paired with latching to latch the compensation (and ultimately the output signal itself) to a particular value, ramp, and/or function for a period following the first-in-time trigger. The latching may repair the signal for a time following the trigger until the triggered latching decays (e.g., subsides, switches off (e.g., by a clock), and/or is otherwise released). The latching may smooth out quickly changing (or multi-valued) signal.

In various implementations, a non-hysteresis comparator may be used to implement first-event-triggering. Hysteresis comparators may be used, but may call for an input offset to correct for the hysteresis effect. The comparator may trigger a flip-flop to latch to a first event. The flip-flop may be reset via a clock signal indicating a new switching cycle. Various capacitor/inductor configurations may be used to implement the latched-state current provision.

Figure 4:
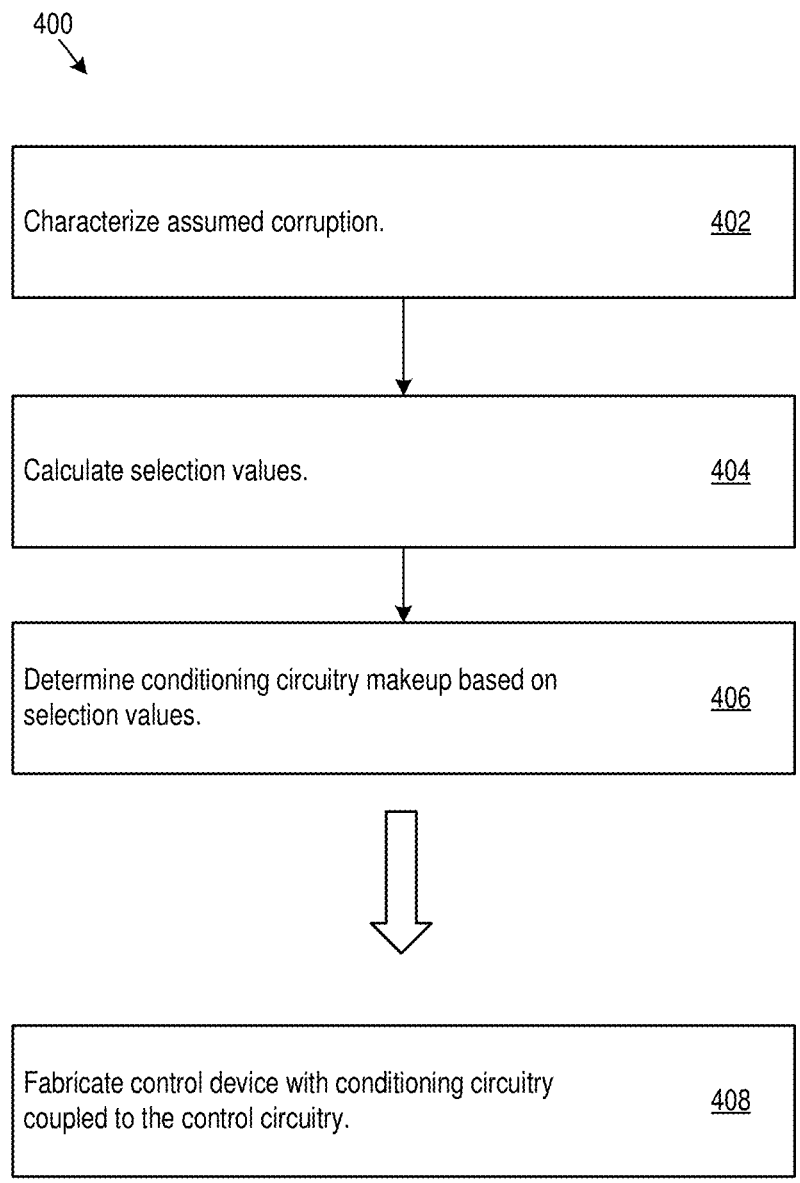
FIG. 4 shows example design logic for control device fabrication.

FIG. 4 shows an example design logic 400 for fabrication of a control device. The example design logic 400 may be executed on circuitry that is other than transitory. The circuitry may include a one or more processors and memory for storage of instructions to execute the logic and/or other data. The circuitry may be integrated into an execution environment which may include network interface circuitry for network and internet connectivity (including for distributed implementations), user interface circuitry for operator input and output display, and/or other circuitry to support user experience and functionality.

The design logic 400 may characterize an assumed corruption in the control device for a specific class of signals (402). For example, the characterization may be for a class of signals having one or more common characteristics. In some cases, the class may be defined by a specific characteristic value, or a characteristic defined by a range of values and/or multiple ranges. For example, a class may include a group of signals having a particular frequency (e.g., time-domain frequency and/or Fourier-domain frequency) element, and/or a group of signals with elements within a range of frequencies. A range may be defined by a tolerance around a defined central value, above a defined value, between two values, and/or below a defined value. Characteristics may include frequencies, voltages, presence of oscillation, amplitude, transition steepness, cycle length, time constants, duty cycle, and/or other signal elements.

Based on the characterization of the assumed corruption, the design logic 400 may calculate one or more selection values from one or more conditioning-type-specific models (404) to determine parameters for conditioning circuitry for the control device. The conditioning-type-specific models may account for design objectives, such as desired output characteristics operating parameters, noise levels, input/output impedances, response times, amplitude ranges, frequency ranges, device efficiency, device cost, or other design goals.

Based on the selection values, the design logic 400 may select the makeup of the conditioning circuitry (406).

Based on the selected makeup/coupling, the control device may be fabricated with conditioning circuitry with the selected makeup coupled to the control circuitry of the control device (408).

Figure 5:
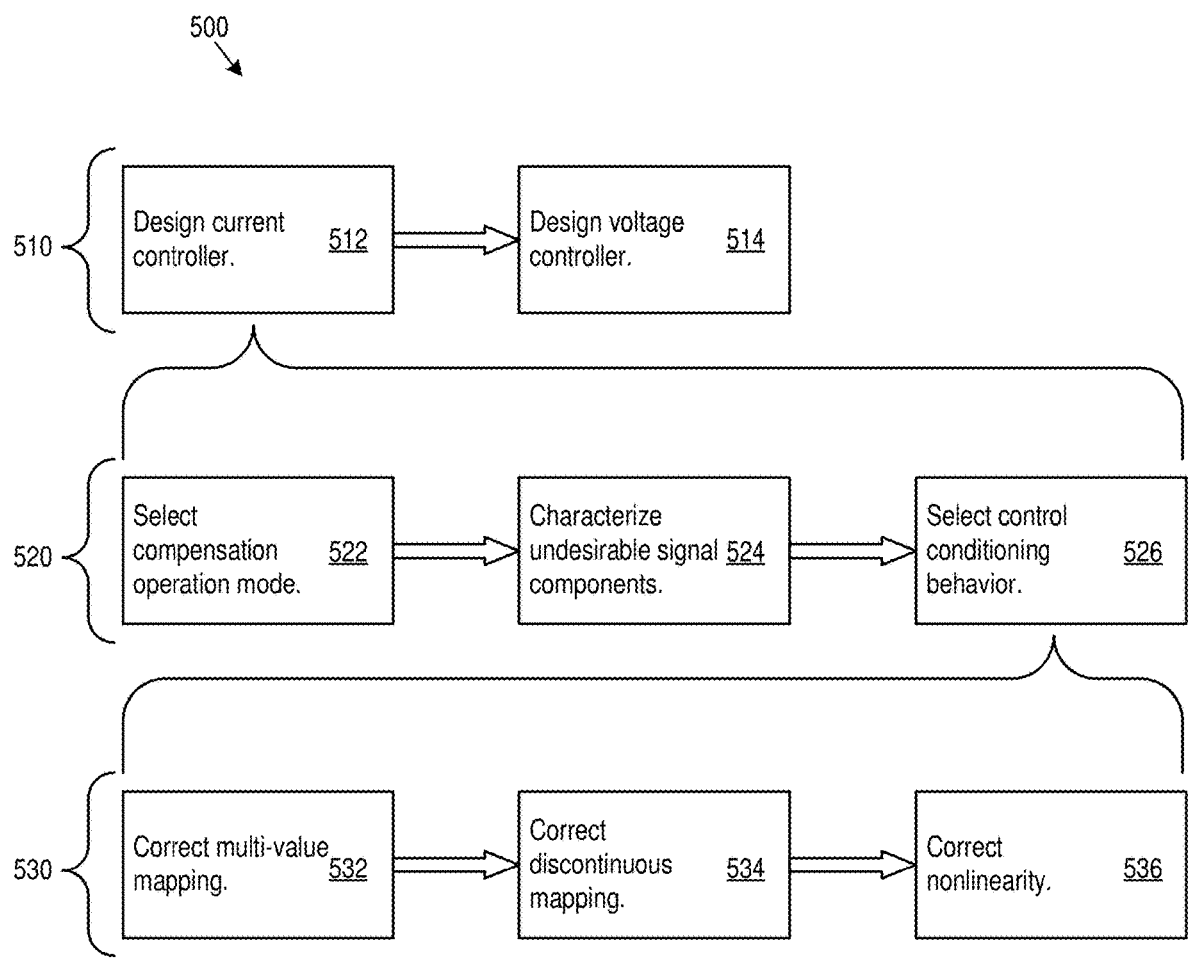
FIG. 5 shows example hierarchical heuristic logic.

FIG. 5 shows example hierarchical heuristic logic 500 for implementation of the fabrication logic 400. The example hierarchical heuristic logic 500 provides a specific decision hierarchy for the fabrication of the control device. First layer 510 design may initiate with current controller design (512). To implement the current controller design (512), the example hierarchical heuristic logic 500 proceeds to the second layer 520. The second layer initiates with selection of the compensation operation mode (522). Once compensation operations are selected, the undesirable signal components may be characterized (524). The characterization may be modeled, empirically measured, selected for correction by general classification, estimated, and/or assumed based on device design. After characterization of the undesirable signal components, the control conditioning behavior may be selected (526). To implement the selection of the control conditioning behavior, the logic 500 may proceed to the third layer 530 of the hierarchy. The third layer 530 may initiate with one or more components of static mapping. In example hierarchical heuristic logic 500 begins with multi-valued correction 532, followed by discontinuous correction 534, and closing with nonlinear correction 536. However, the third layer may be implemented in alterative orders. Similarly, the characterization 524 in the second layer may be performed prior to and/or in parallel with the operation mode selection 522. After execution of the third layer 530, the example hierarchical heuristic logic 500 may return to the first layer 510 and proceed with voltage controller design.

Figure 6:
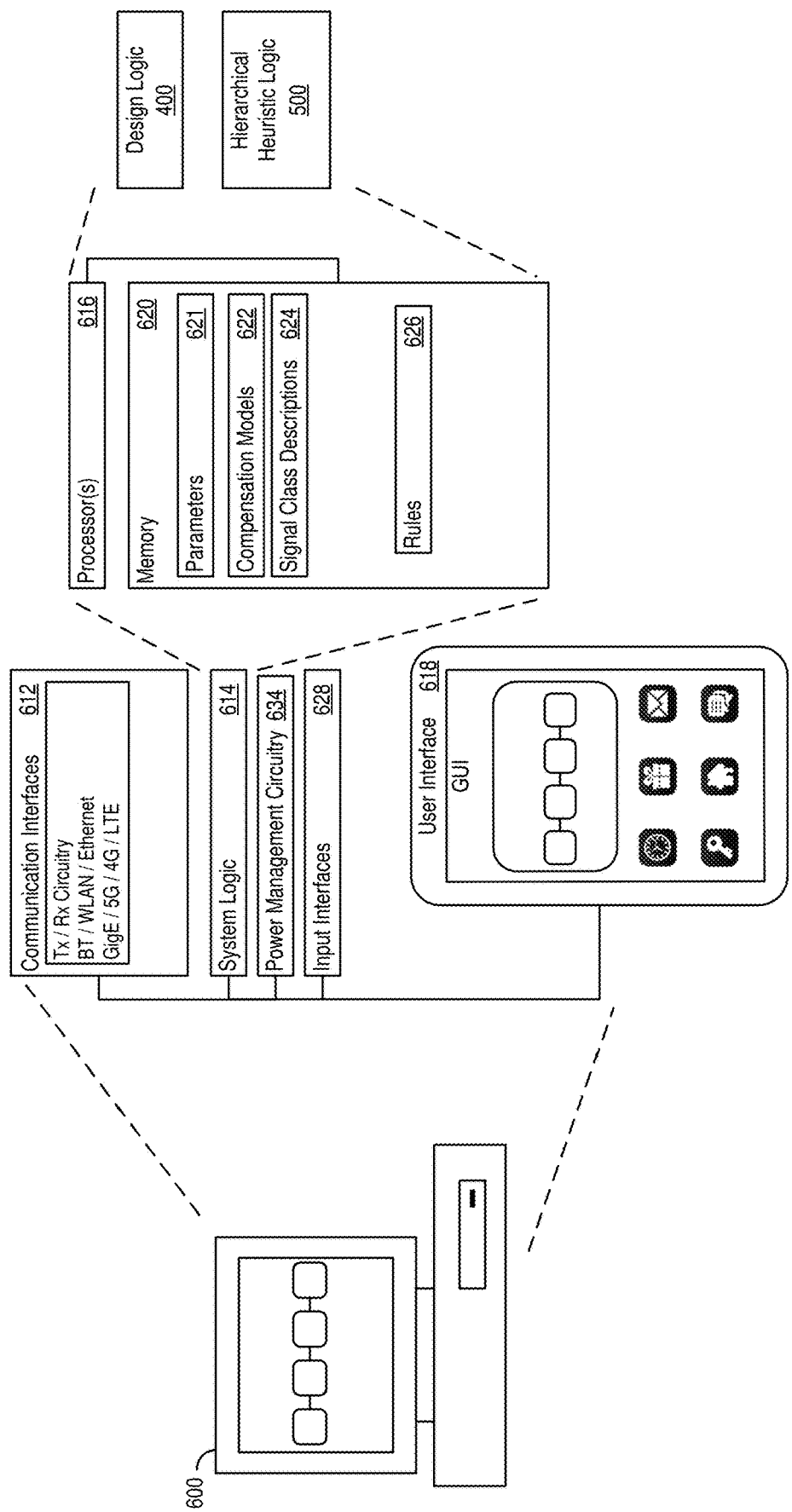
FIG. 6 shows an example design execution system.

FIG. 6 shows an example design execution system (DES) 600, which may provide a hardware environment for execution of the design logic 400 and/or the example hierarchical heuristic logic 500. When configured using logic, such as the example design logic 400 and/or the example hierarchical heuristic logic 500, the hardware of the DES 600 may be special purpose circuitry specifically configured to execute the signal compensation design operations of the design logic 400 and/or the example hierarchical heuristic logic 500. The DES 600 may include system logic 614 to support mode selection, input reception, signal characterization, and/or other design operations. The system logic 614 may include processors 616, memory 620, and/or other circuitry, which may be used to implement the example design logic 400 and/or the example hierarchical heuristic logic 500.

The memory 620 may be used to store, compensation models 622 and/or signal class descriptions 624. The memory 620 may further store parameters 621, such as component parameters, signal characterization parameters, and/or other parameters that may facilitate design of current mode compensation systems. The memory may further store rules 626, which may support execution of hierarchical design operations.

The memory 620 may further include applications and structures, for example, coded objects, templates, or one or more other data structures to support design of current mode compensation systems. The DES 600 may also include one or more communication interfaces 612, which may support wireless, e.g. Bluetooth, Wi-Fi, WLAN, cellular (5G, 4G, LTE/A), and/or wired, ethernet, Gigabit ethernet, optical networking protocols. The DES 600 may include power management circuitry 634 and one or more input interfaces 628.

The DES 600 may also include a user interface 618 that may include man-machine interfaces and/or graphical user interfaces (GUI). The GUI may be used to present options for operation mode selection, signal class selections, and/or other options.

The DES 600 may be deployed on distributed hardware. For example, various functions of the DES 600, e.g., while implementing solver logic, may be executed on cloud-based hardware, distributed static (and/or semi-static) network computing resources, and/or other distributed hardware systems. In various implementations, centralized and/or localized hardware systems may be used. For example, a unitary server or other non-distributed hardware system may perform design operations.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be embodied as a signal and/or data stream and/or may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may particularly include a storage medium and instructions stored in or on the medium, and the instructions when executed by the circuitry in a device may cause the device to implement any of the processing described above or illustrated in the drawings.

The implementations may be distributed as circuitry, e.g., hardware, and/or a combination of hardware and software among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device including:
   output port configured to output an output signal;
   a control port to receive a raw control signal;
   control circuitry configured to control the output signal through an actuation based on the raw control signal and a conditioning response, the actuation causes deviation from an adjustment to the output signal prescribed by the raw control signal;
   conditioning circuitry coupled to the control circuitry, the conditioning circuitry including:
   a feedback port;
   comparator circuitry configured to generate overdrive interference responsive to a feedback signal at the feedback port;
   a feedback path coupled to the feedback port of the conditioning circuitry, the feedback path including a sensor coupled to the output port, the sensor configured to
   monitor the output signal; and
   the conditioning circuitry configured to:
   control a trigger response timing of the actuation by including the overdrive interference in the conditioning response; and
   apply the conditioning response to the control circuitry to cause the actuation.

2. The device of claim 1, where the conditioning response further includes:
   conditioning from a low-pass filter;
   a conditioning ramp; and/or
   a trigger response to a first-in-time event present in the raw control signal.

3. The device of claim 1, where:
the device is configured to generate an assumed corruption in response to a class of signals that includes the raw control signal; and
the actuation is generated such that the deviation mitigates the assumed corruption.

4. The device of claim 3, where the assumed corruption includes ringing and/or a multi-valued instance.

5. The device of claim 1, further including:
control plant circuitry configured to generate the output signal based on the actuation; and
comparator circuitry configured to compare the feedback signal to the raw control signal.

6. The device of claim 1, where the overdrive interference includes:
positive interference to control the trigger response timing by delaying an early trigger response; and/or
negative interference to control the trigger response timing by advancing a late trigger response.

7. The device of claim 1, where the comparator circuitry includes multi-stage comparator circuitry.

8. The device of claim 1, where the device includes a power converter.

9. The device of claim 8, where the power converter includes a buck converter, a boost converter, and/or a variable frequency power converter.

10. The device of claim 1, where the control circuitry is further configured to provide the actuation by generating an inductance that generates an output inductor current within the output signal.

11. A method including:
receiving a raw control signal at a control port;
outputting an output signal at an output port;
at control circuitry
controlling the output signal through an actuation based on the raw control signal and a conditioning response, the actuation causes deviation from an adjustment to the output signal prescribed by the raw control signal; and
at conditioning circuitry coupled to the control circuitry:
monitoring, via a sensor of the conditioning circuitry coupled to a feedback path, the output signal;
controlling a trigger response timing of the actuation by generating, via a comparator of the conditioning circuitry, overdrive interference for the conditioning response responsive to a feedback signal at a feedback port, where the feedback path couples the sensor to the feedback port; and
applying the conditioning response to the control circuitry to cause the actuation.

12. The method of claim 11, where the conditioning response further includes:
conditioning from a low-pass filter;
a conditioning ramp; and/or
a trigger response to a first-in-time event present in the raw control signal.

13. The method of claim 11, further including:
generating an assumed corruption in response to a class of signals that includes the raw control signal, where the actuation is generated such that the deviation mitigates the assumed corruption.

14. The method of claim 13, where the assumed corruption includes ringing and/or a multi-valued instance.

15. The method of claim 11, further including:
generating, at control plant circuitry, the output signal based on the actuation; and
comparing, at comparator circuitry, the feedback signal to the raw control signal.

16. The method of claim 11, where the overdrive interference includes:
positive interference to control the trigger response timing by delaying an early trigger response; and/or
negative interference to control the trigger response timing by advancing a late trigger response.

17. The method of claim 11, where the comparator circuitry includes multi-stage comparator circuitry.

18. The method of claim 11, further including providing the actuation by generating, at the control circuitry, an inductance that generates an output inductor current within the output signal.

19. A device including:
conditioning circuitry including:
a feedback port; and
comparator circuitry configured to generate overdrive interference for a conditioning response to control a trigger response timing of actuation for correction of an output signal, the overdrive interference based on a feedback signal at the feedback port;
a feedback path coupled to the feedback port of the conditioning circuitry, the feedback path including a sensor configured to monitor the output signal; and
the conditioning circuitry configured to apply the conditioning response to control circuitry to cause the actuation by the control circuitry for correction of the output signal.

20. The device of claim 19, where the conditioning response further includes:
conditioning from a low-pass filter;
a conditioning ramp; and/or
a trigger response to a first-in-time event present in a raw control signal at a control signal input port of the control circuitry.

* * * * *